(12) United States Patent
Sobolewski

(10) Patent No.: US 11,927,605 B2
(45) Date of Patent: Mar. 12, 2024

(54) INTERCONNECT SYSTEM WITH HIGH CURRENT AND LOW LEAKAGE CAPABILITY

(71) Applicant: Keithley Instruments, LLC, Solon, OH (US)

(72) Inventor: Gregory Sobolewski, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 584 days.

(21) Appl. No.: 16/886,229

(22) Filed: May 28, 2020

(65) Prior Publication Data

US 2020/0386790 A1 Dec. 10, 2020

Related U.S. Application Data

(60) Provisional application No. 62/858,291, filed on Jun. 6, 2019.

(51) Int. Cl.
*G01R 1/36* (2006.01)
*G01R 1/20* (2006.01)
*G01R 1/24* (2006.01)

(52) U.S. Cl.
CPC .............. *G01R 1/36* (2013.01); *G01R 1/206* (2013.01); *G01R 1/24* (2013.01)

(58) Field of Classification Search
CPC ...... G01R 15/12; G01R 15/144; G01R 19/00; G01R 19/30; G01R 21/06; G01R 31/261; G01R 31/2623
See application file for complete search history.

(56) References Cited

U.S. PATENT DOCUMENTS

| | | | | |
|---|---|---|---|---|
| 5,345,182 | A | * | 9/1994 | Wakamatsu ........... G01R 27/06 324/649 |
| 8,410,804 | B1 | * | 4/2013 | Goeke ................ G01R 1/06772 324/755.02 |
| 2007/0182429 | A1 | * | 8/2007 | Goeke .................. G01R 1/0416 324/755.02 |
| 2011/0018565 | A1 | * | 1/2011 | Yiang ................ G01R 31/2623 324/754.03 |
| 2016/0084878 | A1 | * | 3/2016 | Goeke .................. G01R 1/0416 324/755.02 |

* cited by examiner

*Primary Examiner* — Tung X Nguyen

(74) *Attorney, Agent, or Firm* — Miller Nash LLP; Andrew J. Harrington

(57) ABSTRACT

A test and measurement instrument switch matrix including a first cable including a center conductor and a guard connected to a first output of the test and measurement instrument; a second cable including a center conductor and a guard connected to a second output of the test and measurement instrument; a third cable including a center conductor and a guard connected to the device under test; and a fourth cable including a center conductor connected to the device under test and a guard connected to the device under test.

18 Claims, 4 Drawing Sheets

INTERCONNECT SYSTEM WITH HIGH CURRENT AND LOW LEAKAGE CAPABILITY

PRIORITY

This disclosure claims benefit of U.S. Provisional Application No. 62/858,291, titled "INTERCONNECT SYSTEM WITH HIGH CURRENT AND LOW LEAKAGE CAPABILITY," filed on Jun. 6, 2019, which is incorporated herein by reference in its entirety.

TECHNICAL FIELD

This disclosure is directed to systems and methods related to test and measurement systems, and in particular, to an interconnect system between a test and measurement instrument, such as a source measure unit (SMU), and a device under test (DUT).

BACKGROUND

Test and measurement systems are designed to receive and test signals from a DUT. In some test and measurement systems, such as those including an SMU, the test and measurement system also sends signals to the DUT to test the response of the DUT. In some systems, switching devices are employed to switch between different inputs and outputs of the test and measurement system and the DUT.

Typically, triaxial cabling is used in such systems. However, triaxial cable often suffers from a relatively high resistance of a center conductor, especially in high voltage applications. In high voltage applications, the outcome is that the maximum current through the switching device is quite limited.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Conventional switch matrices in a test and measurement system use a number of cables, usually triaxial cables, to connect a DUT to a test and measurement instrument. For example, to connect an SMU to a DUT, a switch matrix may include at least one HI force cable and one LO force cable, as well as at least one HI sensing cable and one LO sensing cable. The force cables send signals to the DUT while the sensing cables carry the measurements from the DUT to the test and measurement instrument.

Triaxial cables include a center conductor as well as a conductive inner sheath or shield that is coaxial with and surrounding the center conductor. The conductive inner shield can be referred to as a guard. A guard signal is routed through the guard, along with the force and sense signals through the center conductors, to minimize error currents in the cabling and any switches present in the system. Triaxial cables also include a conductive outer shield, shell, or casing that is coaxial with and surrounding both the center conductor and the guard. Triaxial cable, however, often suffers from a relatively high resistance of the center conductor, especially if the triaxial cable is for high voltage application. In these cases, the maximum current through the triaxial cable is quite limited and such switching devices cannot be utilized effectively in high current applications.

Figure 1:
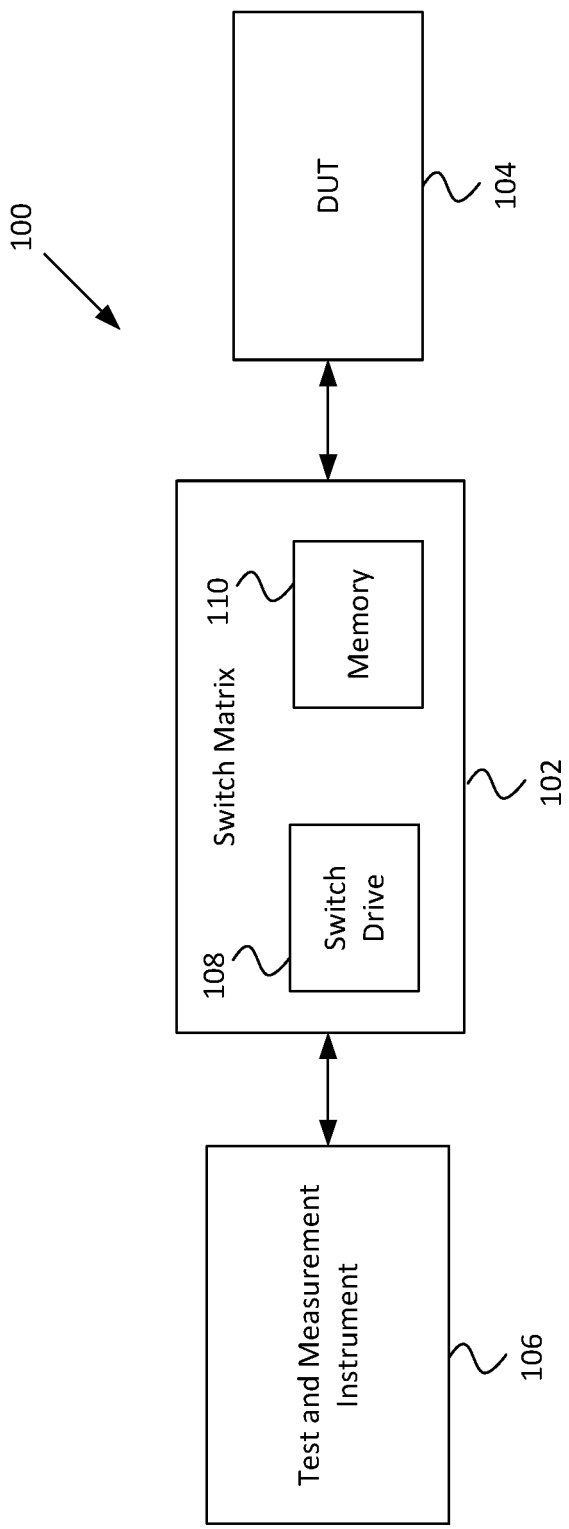
FIG. 1 is a block diagram of an example test system according to some embodiments of the disclosure.

FIG. 1 illustrates an example block diagram of an example test system 100 including a switch matrix 102 connected to a DUT 104 and a test and measurement instrument 106. The switch matrix 102 is configured to switch test signals between the test and measurement instrument 106 and the DUT 104. The switch matrix 102 may include one or more drivers 108 to control the switches in the switch matrix 102. The one or more drivers 108 may include one or more controllers or processors. The switch matrix 102 may also include a memory 110 for storing instructions to be executed by the one or more drivers and/or processors 108. In some embodiments, the instructions for the one or more drivers 108 are transmitted from the test and measurement instrument 106.

As will be understood by one skilled in the art, although the switch matrix 102 is shown separated from the test and measurement instrument 106, in some embodiments, the switch matrix 102 may be included as a component of the test and measurement instrument 106.

Figure 2:
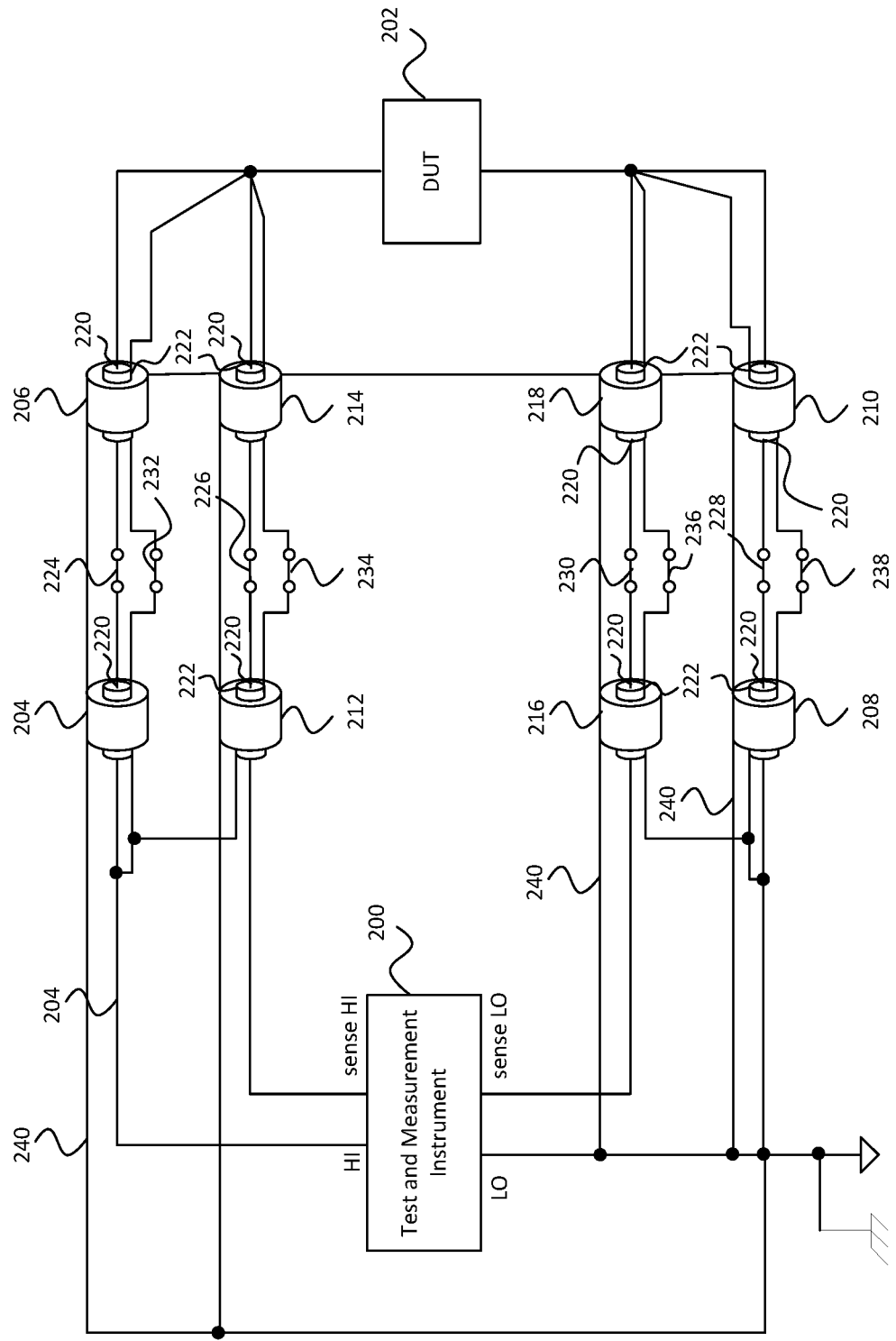
FIG. 2 is a diagram of an example switch matrix of FIG. 1 according to some embodiments of the disclosure.

FIG. 2 illustrates an example switch matrix, according to some embodiments of the disclosure, which may be used as switch matrix 102. The switch matrix is shown in FIG. 2 connected to a test and measurement instrument 200, such as an SMU, and a DUT 202. For ease of illustration, the switch matrix of FIG. 2 does not depict the various other components of the switch matrix, such as one or more processors, drivers, memory, etc.

The switch matrix may include paths for HI signals and LO signals, as will be understood by one skilled in the art, as well as forcing and sensing paths. The switch matrix includes a number of force cables 204, 206, 208, 210 and a number of sense cables 212, 214, 216 and 218. Each of the cables includes a center conductor 220 and a guard 222, which may also be referred to as an inner shield. Voltages and/or currents are sent to the DUT 202 from the test and measurement instrument 200 through the force cables 204, 206, 208, 210, while voltages and/or currents from the DUT 202 are sent to the test and measurement instrument 200 through the sensing cables 212, 214, 216 and 218 for measurement.

A HI signal from the test and measurement instrument 200 can be routed to the DUT through a center conductor 220 of force cables 204 and 206. A switch 224 may be provided between the cables 204 and 206. The center conductor 220 of the force cable 206 is connected to the DUT 202. The center conductor 220 of the force cable 204 is connected to the test and measurement instrument 200.

A HI signal from the DUT 202 can be routed to the test and measurement instrument 200 through center conductors 220 of sense cables 212 and 214. A switch 226 may be provided between the sense cables 212 and 214. The center conductor 220 of the sense cable 214 is connected to the DUT 202. The center conductor 220 of the sense cable 212 is connected to the test and measurement instrument 200.

A LO signal from the test and measurement instrument 200 can be routed to the DUT 202 through center conductors 220 of force cables 208 and 210. A switch 228 may be provided between the force cables 208 and 210. The center conductor 220 of the force cable 210 is connected to the DUT 202. The center conductor 220 of the force cable 208 is connected to the test and measurement instrument 200.

A LO signal from the DUT 202 can be routed to the test and measurement instrument 200 through center conductors 220 of sense cables 216 and 218. A switch 230 may be provided between the sense cables 216 and 218. The center conductor 220 of the sense cable 218 is connected to the DUT 202. The center conductor 220 of the sense cable 216 is connected to the test and measurement instrument 200.

Switches 232, 234, 236 and 238 may also be provided between, respectively, the HI force cable pair 204 and 206, the HI sense cable pair 212 and 214, the LO sense cable pair 216 and 218, and the LO force cable pair 208 and 210 to connect the guards 222 of each of these cable pairs. The guards 222 of cables 204 and 212 are connected to each other, and the guards 222 of cables 206 and 214 are connected to each other. The guards 222 of cables 216 and 208 are connected to each other, and the guards 222 of cables 208 and 210 are connected to each other.

Unlike a conventional switch matrix, however, a separate guard signal is not sent to the guards 222 of the various force and sensing cables 204, 206, 208, 210, 212, 214, 216, and 218. Rather, the guard 222 of each of the force cable 204 and the sense cable 212 is shorted or electrically connected to the center conductor 220 of the force cable 204 so that the HI force signal is sent to the DUT through the guard 222 of cables 204 and 212. The guard 222 of each of the force cable 208 and the sense cable 216 is shorted to the center conductor 220 of the force cable 208 so that the LO force signal is sent to the DUT through the guard 222 of cables 208 and 216. The guard 222 of cables 206, 210, 214, and 218 are each connected to the respective center conductors 220 of cables 206, 210, 214, and 218, as well as to the DUT 202.

Further, an outer shield 240 of each of the cables 204, 206, 208, 210, 212, 214, 216, and 218 are connected together at the LO output of the test and measurement instrument 200, and are also connected together at a location in close proximity to the DUT 202, as illustrated in FIG. 2. Connecting the outer shield 240 of each of the cables 204, 206, 208, 210, 212, 214, 216, and 218 in this manner can allow for overall connection inductance to stay low and enable high speed, high current pulsing.

The switch matrix of FIG. 2 provides much lower path resistance through the guard 222 and therefore greater current carrying capability than a convention switch matrix with a separate guard signal. Further, although not shown in FIG. 2, additional cables may be provided in the system which do not have the guard 222 shorted to a center conductor 220, and these pathways may still provide full low leakage capability.

Figure 3:
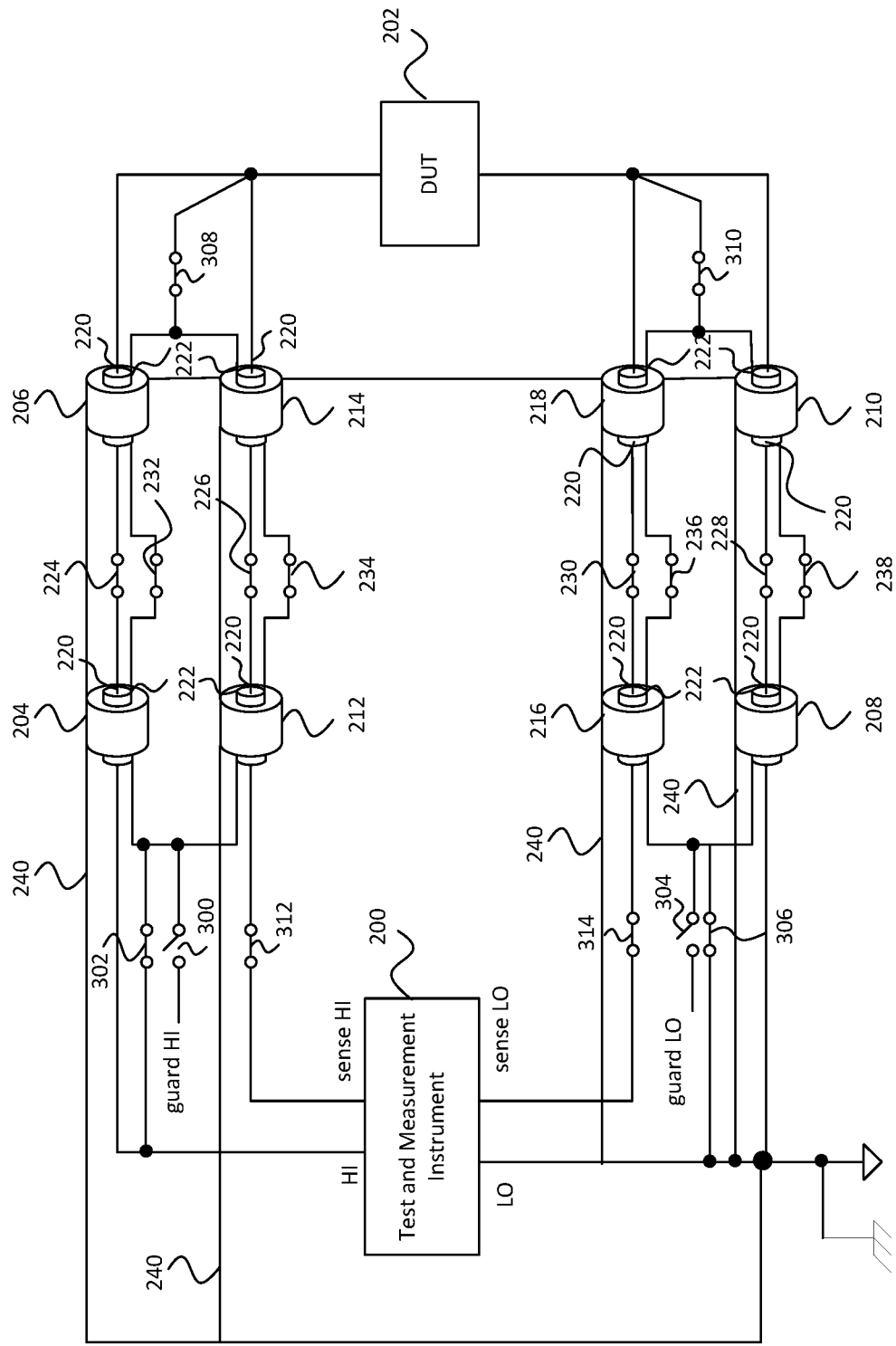
FIG. 3 is a diagram of another example switch matrix of FIG. 1 according to some embodiments of the disclosure.

FIG. 3 illustrates another example of a switch matrix, according to some embodiments of the disclosure, that may be used as switch matrix 102 of FIG. 1. Again, for ease of discussion, various other components of the switch matrix of FIG. 3, as illustrated in FIG. 1, are not depicted in FIG. 3. Further, components discussed above with respect to FIG. 2 that are included in the switch matrix of FIG. 3 are given the same reference numbers and are not discussed in further detail with respect to FIG. 3.

In the switch matrix of FIG. 3, a switch 300 may be provided for a HI guard signal that can be switched in to the guards 222 of the force cable 204 and the sense cable 212. Further, another switch 302 can be provided between the HI signal of the test and measurement instrument 200 and the guards 222 of the force cable 204 and the sense cable 212. Similarly, a switch 304 can be provided for a LO guard signal that can be switched in to the guards 222 of the force cable 208 and the sense cable 216. Further, switch 306 can be provided between the LO signal of the test and measurement instrument 200 and the guards 222 of the force cable 208 and the sense cable 216.

Guards 222 of cables 206 and 214 are connected to each other, and guards 222 of cables 210 and 218 are connected to each other. A switch 308 may be provided to connect the guards 222 of cables 206 and 214 to the DUT 202, and a switch 310 may be provided to connect the guards 222 of cables 214 and 218 to the DUT 202.

Switches 312 and 314 may also be provided on the test and measurement instrument 200 side of the switch matrix to switch in the sensing signals from sensing cables 212 and 216.

With these switches, the switch matrix of FIG. 3 can provide both high current with a remote sense and low current with guarded pathways capability. When higher current is being used, the guard signals can be switched out and the force signals from the test and measurement instrument 202 can be switched in to the guards 222 instead.

Figure 4:
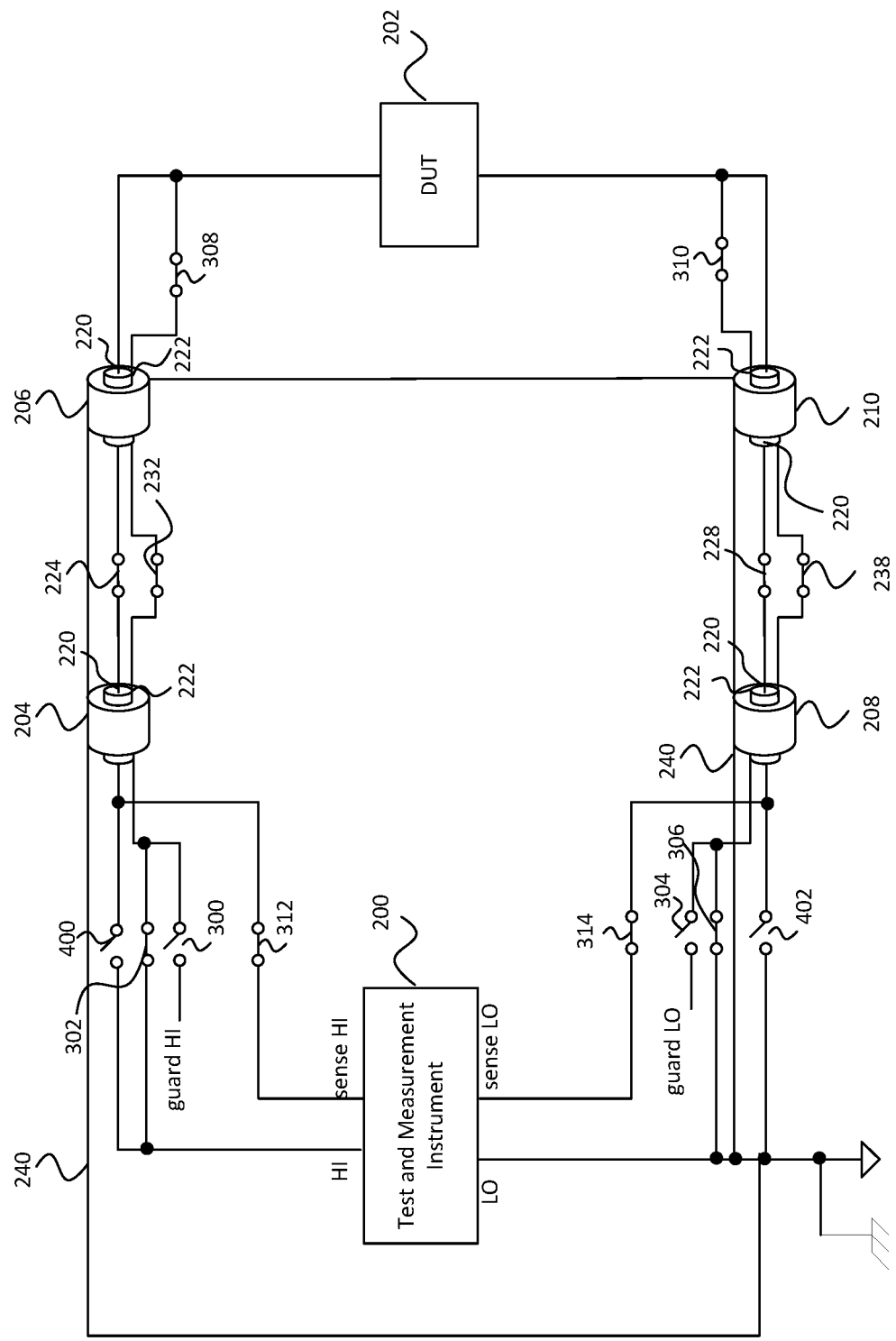
FIG. 4 is a diagram of another example switch matrix of FIG. 1 according to some embodiments of the disclosure.

FIG. 4 illustrates yet another example of a switch matrix, according to some embodiments of the disclosure, that may be used as switch matrix 102 of FIG. 1. Again, for ease of discussion, various other components of the switch matrix of FIG. 4, as illustrated in FIG. 1, are not depicted in FIG. 4. Further, components discussed above with respect to FIGS. 2 and 3 that are included in the switch matrix of FIG. 4 are given the same reference numbers and are not discussed in further detail with respect to FIG. 4.

In the switch matrix of FIG. 4, cables 204, 206, 208, and 210 may be used both as force cables and sense cables. Additional switches 400 and 402 may be added to switch in the HI and LO signals from the test and measurement instrument 200 to the center conductors 220 of cables 204 and 208.

With the switch matrix of FIG. 4, both high current, remote sensing measurements can be taken, and through the same pathway, low leakage capability can be achieved while maintaining compatibility with existing infrastructure. Elimination of the dedicated sense pathways reduces the system cost of the switch matrix, while also reducing the size and improving reliability due to fewer components being in the switch matrix.

In each of the switch matrices of FIGS. 2-4, directly connecting the guard to the HI or LO output of the test and measurement instrument 200 allows for higher current to pass through the switch matrix and perform remote sense measurements of the DUT 202, which conventional switch matrices using triaxial cable are unable to do, given the small, high resistance center conductor of the triaxial cables. The one or more drivers 108 of the switch matrix can operate the various switches of the switch matrixes of FIGS. 2-4 to allow for the force and sensing signals to be sent between the test and measurement instruments 200 and the DUTs 202. In some embodiments, the memory 110 stores the instructions for the one or more drivers 108, while in other embodiments, instructions may be sent from the test and measurement instrument 200.

For example, in the switch matrices of FIGS. 3 and 4, the test and measurement instrument 200 may include instructions for driving the one or more drivers 108, as discussed above. When a current goes above a threshold, then the test and measurement instrument 200 may instruct the switches to connect the guard 222 of cables 204, 208, 212, and/or 216 to the HI or LO force signal from the test and measurement instrument.

Further, while switches 300, 302, 304, 306, 312, 314, 400, and 402 are shown as a part of the switch matrices of FIGS. 3 and 4, in some embodiments, these switches may be included directly in the test and measurement instrument 200 and driven by one or more processors and/or drivers in the test and measurement instrument 200.

In some embodiments, the outer shields 240 of each of the cables 204, 206, 208, 210, 212, 214, 216, and 218 are connected together at the LO output of the test and measurement instrument 200 through a switch, as will be understood by one skilled in the art. For example, the outer shields 240 may not be connected to the LO output of the test and measurement instrument 200 when only a DC high current is needed.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement instrument switch matrix, comprising a first cable including a center conductor and a guard connected to a first output of the test and measurement instrument; a second cable including a center conductor and a guard connected to a second output of the test and measurement instrument; a third cable including a center conductor and a guard connected to the device under test; and a fourth cable including a center conductor connected to the device under test and a guard connected to the device under test.

Example 2 is the test and measurement instrument switch matrix of example 1, wherein an outer shield of each of the first cable, the second cable, the third cable, and the fourth cable are connected to each other and the second output of the test and measurement instrument.

Example 3 is the test and measurement instrument switch matrix of either one of examples 1 and 3, further comprising a fifth cable including a center conductor connected to a first input of the test and measurement instrument and a guard; a sixth cable including a center conductor connected to a second input of the test and measurement instrument and a guard; a seventh cable including a center conductor and a guard connected to the device under test; and an eighth cable including a center conductor connected to the device under test and a guard connected to the device under test and the guard of the fourth cable.

Example 4 is the test and measurement instrument switch matrix of example 3, wherein the guard of the fifth cable is connected to the first output of the test and measurement instrument.

Example 5 is the test and measurement instrument switch matrix of example 4, further including a first switch to connect the guard of the fifth cable to the first output of the test and measurement instrument.

Example 6 is the test and measurement instrument switch matrix of example 5, further including a second switch to connect the guard of the first cable and the guard of the fifth cable to a first guard signal.

Example 7 is the test and measurement instrument switch matrix of example 6, further including a third switch to connect the guard of the second cable and the guard of the sixth cable to a second guard signal.

Example 8 is the test and measurement instrument switch matrix of any one of examples 1 through 7, further comprising a first switch to connect the guard of the first cable to the first output; a second switch to connect the guard of the first cable to a first guard signal; a third switch to connect the guard of the second cable to the second output; and a fourth switch to connect the guard of the second cable to a second guard signal.

Example 9 is the test and measurement instrument switch matrix of any one of examples 1 through 8, further comprising a first switch to connect the center conductor of the first cable to the first output of the test and measurement instrument; and a second switch to connect the center conductor of the second cable to the second output of the test and measurement instrument.

Example 10 is the test and measurement instrument switch matrix of example 9, further comprising a third switch to connect the center conductor of the first cable to a first input of the test and measurement instrument; and a fourth switch to connect the center conductor of the second cable to a second input of the test and measurement instrument.

Example 11 is the test and measurement instrument switch matrix of any one of examples 1 through 10, further comprising a first switch to connect the guard of the third cable to the device under test; and a second switch to connect the guard of the fourth cable to the device under test.

Example 12 is the test and measurement instrument switch matrix of any one of examples 1 through 11, wherein each of the first cable, the second cable, the third cable, and the fourth cable are triaxial cables.

Example 13 is a test and measurement system, comprising the test and measurement switch matrix of example 1; and a test and measurement instrument connected to the test and measurement switch matrix, the test and measurement instrument comprising a first switch to connect the guard of the first cable to the first output; a second switch to connect the guard of the first cable to a first guard signal; a third switch to connect the guard of the second cable to the second output; and a fourth switch to connect the guard of the second cable to a second guard signal.

Example 14 is the test and measurement system of example 13, wherein the test and measurement instrument further comprises a fourth switch to connect the center conductor of the first cable to the first output of the test and measurement instrument; and a fifth switch to connect the center conductor of the second cable to the second output of the test and measurement instrument.

Example 15 is the test and measurement system of example 14, wherein the test and measurement instrument further comprises a sixth switch to connect the center conductor of the first cable to a first input of the test and measurement instrument; and a seventh switch to connect the center conductor of the second cable to a second input of the test and measurement instrument.

Example 16 is the test and measurement system of either one of examples 13 through 15, wherein the test and measurement instrument further comprises one or more processors configured to connect the guard of the first cable to the first output by the first switch and connect the guard of the second cable to the second output by the third switch when a current of the first output or the second output exceeds a threshold.

Example 17 is a method for operating a switch matrix connected to a test and measurement instrument and a device under test, the method comprising transmitting a first output of the test and measurement instrument through a center conductor and a guard of a first cable to the device under test; and transmitting a second output of the test and measurement instrument through a center conductor and a guard of a second cable to the device under test.

Example 18 is the method of example 17, further comprising switching the guard of the first cable to transmit a first guard signal.

Example 19 is the method of example 18, wherein switching the guard of the first cable to transmit a first guard signal includes switching the guard of the first cable to transmit the first guard signal when a current of the first output is below a threshold.

Example 20 is the method of any one of examples 17 through 19, further comprising switching the center conductor of the first cable to a first input of the test and measurement instrument; and switching the center conductor of the second cable to a second input of the test and measurement instrument.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A test and measurement instrument switch matrix, comprising:
   a first triaxial cable including a center conductor and a guard, the center conductor connected to a first output of the test and measurement instrument;
   a second triaxial cable including a center conductor and a guard, the center conductor connected to a second output of the test and measurement instrument;
   a third triaxial cable including a center conductor and a guard, the center conductor connected to the device under test;
   a fourth triaxial cable including a center conductor connected to the device under test and a guard connected to the device under test;
   a first guard switch to connect the guard of the first cable to the first output;
   a second guard switch to connect the guard of the first cable to a first guard signal;
   a third guard switch to connect the guard of the second cable to the second output; and
   a fourth guard switch to connect the guard of the second cable to a second guard signal.

2. The test and measurement instrument switch matrix of claim 1, wherein an outer shell of each of the first cable, the second cable, the third cable, and the fourth cable are connected to each other and the second output of the test and measurement instrument.

3. The test and measurement instrument switch matrix of claim 1, further comprising:
a fifth cable including a center conductor connected to a first input of the test and measurement instrument and a guard;
a sixth cable including a center conductor connected to a second input of the test and measurement instrument and a guard;
a seventh cable including a center conductor and a guard connected to the device under test; and
an eighth cable including a center conductor connected to the device under test and a guard connected to the device under test and the guard of the fourth cable.

4. The test and measurement instrument switch matrix of claim 3, wherein the guard of the fifth cable is connected to the first output of the test and measurement instrument.

5. The test and measurement instrument switch matrix of claim 4, further including a fifth guard switch to connect the guard of the fifth cable to the first output of the test and measurement instrument.

6. The test and measurement instrument switch matrix of claim 5, further including a sixth guard switch to connect the guard of the first cable and the guard of the fifth cable to a first guard signal.

7. The test and measurement instrument switch matrix of claim 6, further including a seventh guard switch to connect the guard of the second cable and the guard of the sixth cable to a second guard signal.

8. The test and measurement instrument switch matrix of claim 1, further comprising:
a first switch to connect the center conductor of the first cable to the first output of the test and measurement instrument; and
a second switch to connect the center conductor of the second cable to the second output of the test and measurement instrument.

9. The test and measurement instrument switch matrix of claim 8, further comprising:
a third switch to connect the center conductor of the first cable to a first input of the test and measurement instrument; and
a fourth switch to connect the center conductor of the second cable to a second input of the test and measurement instrument.

10. The test and measurement instrument switch matrix of claim 1, further comprising:
a fifth guard switch to connect the guard of the third cable to the device under test; and
a sixth guard switch to connect the guard of the fourth cable to the device under test.

11. A test and measurement system, comprising:
the test and measurement switch matrix of claim 1; and
a test and measurement instrument connected to the test and measurement switch matrix.

12. The test and measurement system of claim 11, wherein the test and measurement instrument further comprises:
a fifth switch to connect the center conductor of the first cable to the first output of the test and measurement instrument; and
a sixth switch to connect the center conductor of the second cable to the second output of the test and measurement instrument.

13. The test and measurement system of claim 12, wherein the test and measurement instrument further comprises:
a seventh switch to connect the center conductor of the first cable to a first input of the test and measurement instrument; and
an eighth switch to connect the center conductor of the second cable to a second input of the test and measurement instrument.

14. The test and measurement system of claim 11, wherein the test and measurement instrument further comprises one or more processors configured to connect the guard of the first cable to the first output by the first switch and connect the guard of the second cable to the second output by the third switch when a current of the first output or the second output is greater than a threshold.

15. A method for operating a switch matrix connected to a test and measurement instrument and a device under test, the method comprising:
transmitting a high current output of the test and measurement instrument through a center conductor and a guard of a first cable to the device under test; and
transmitting a low current output, having lower current than the high current output, of the test and measurement instrument through a center conductor and a guard of a second cable to the device under test, without sending a separate guard current signal to the guard of a first cable or the guard of the second cable.

16. The method of claim 15, further comprising switching the guard of the first cable to transmit a first guard signal.

17. The method of claim 16, wherein switching the guard of the first cable to transmit a first guard signal includes switching the guard of the first cable to transmit the first guard signal when a current of the high current output is above a threshold.

18. The method of claim 15, further comprising:
switching the center conductor of the first cable to a first input of the test and measurement instrument; and
switching the center conductor of the second cable to a second input of the test and measurement instrument.

* * * * *